United States Patent
Ogimoto

(10) Patent No.: US 8,878,322 B2
(45) Date of Patent: *Nov. 4, 2014

(54) PEROVSKITE MANGANESE OXIDE THIN FILM AND MANUFACTURING METHOD THEREFOR

(75) Inventor: Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/817,127

(22) PCT Filed: Nov. 28, 2011

(86) PCT No.: PCT/JP2011/077356
§ 371 (c)(1),
(2), (4) Date: Feb. 14, 2013

(87) PCT Pub. No.: WO2012/077518
PCT Pub. Date: Jun. 14, 2012

(65) Prior Publication Data
US 2013/0140661 A1    Jun. 6, 2013

(30) Foreign Application Priority Data
Dec. 9, 2010 (JP) ................................. 2010-274170

(51) Int. Cl.
*H01L 29/82* (2006.01)
*H01L 43/10* (2006.01)
(Continued)

(52) U.S. Cl.
CPC .............. *H01L 43/10* (2013.01); *H01L 45/147* (2013.01); *C23C 14/08* (2013.01);
(Continued)

(58) Field of Classification Search
None
See application file for complete search history.

(56) References Cited

U.S. PATENT DOCUMENTS

| 5,665,664 A | 9/1997 | Tomioka et al. |
| 6,136,457 A | 10/2000 | Miyano et al. |
| 2013/0189542 A1* | 7/2013 | Ogimoto ...................... 428/701 |

FOREIGN PATENT DOCUMENTS

| EP | 0864538 A1 | 9/1998 |
| JP | 08-133894 A | 5/1996 |

(Continued)

OTHER PUBLICATIONS

Nakajima et al.; Epitaxial A-Site Ordered Perovskite Manganite SmBaMn$_2$O$_6$ Film on SrTiO$_3$(001): Fabrication, Structure, and Physical Property; American Chmical Society, vol. 19, No. 22, Oct. 9, 2007; p. 5355-5362.

(Continued)

*Primary Examiner* — Kyoung Lee
(74) *Attorney, Agent, or Firm* — Rabin & Berdo, P.C.

(57) ABSTRACT

A perovskite manganese oxide thin film formed on a substrate that allows a first order phase transition and has A-site ordering. The thin film contains Ba and a rare earth element in the A sites of a perovskite crystal lattice and has an (m10) orientation for which m=2n, and 9≥n≥1. A method for manufacturing the film includes forming in a controlled atmosphere using laser ablation an atomic layer or thin film that assumes a pyramidal structure having oxygen-deficient sites in a plane containing the rare earth element and oxygen; and filling the oxygen-deficient sites with oxygen. The controlled atmosphere has an oxygen partial pressure controlled to a thermodynamically required value for creating oxygen deficiencies and contains a gas other than oxygen, and has a total pressure that is controlled to a value at which the A sites have a fixed compositional ratio.

10 Claims, 7 Drawing Sheets

(51) Int. Cl.
- *H01L 45/00* (2006.01)
- *C23C 14/08* (2006.01)
- *C23C 14/28* (2006.01)
- *C30B 29/22* (2006.01)
- *C30B 23/06* (2006.01)
- *H01L 43/12* (2006.01)

(52) U.S. Cl.
CPC ............... *H01L 45/04* (2013.01); *C23C 14/28* (2013.01); *C30B 29/22* (2013.01); *H01L 45/1625* (2013.01); *C30B 23/066* (2013.01); *H01L 43/12* (2013.01)
USPC ........... 257/421; 257/200; 257/350; 428/336; 428/629; 428/700; 428/701

(56) References Cited

FOREIGN PATENT DOCUMENTS

| | | |
|---|---|---|
| JP | 10-255481 A | 9/1998 |
| JP | 10-261291 A | 9/1998 |
| JP | 2005-213078 A | 8/2005 |
| JP | 2008-156188 | 7/2008 |

OTHER PUBLICATIONS

Serenkov et al.; Structural distortions induced during stress relaxation affecting electrical transport of nanometer-thick $La_{0.67}(Ba_1Ca)_{0.33}MnO_3$ films; Physical E; 2009, p. 5234-5236.

Ogimoto et al.; The essentials for the control of charge-orbital ordering in thin films of perovskite manganites; Materials Science and Engineering; 2010; p. 51-56.

K.X. Jin et al.: "Transport and photoinduced properties in $La_{0.8}Sn_{0.2}MnO_3$ thin film," Journal of Alloys and Compounds, US, Elsevier B.V., vol. 470, No. 1-2, Feb. 20, 2009, pp. 552-556.

\* cited by examiner

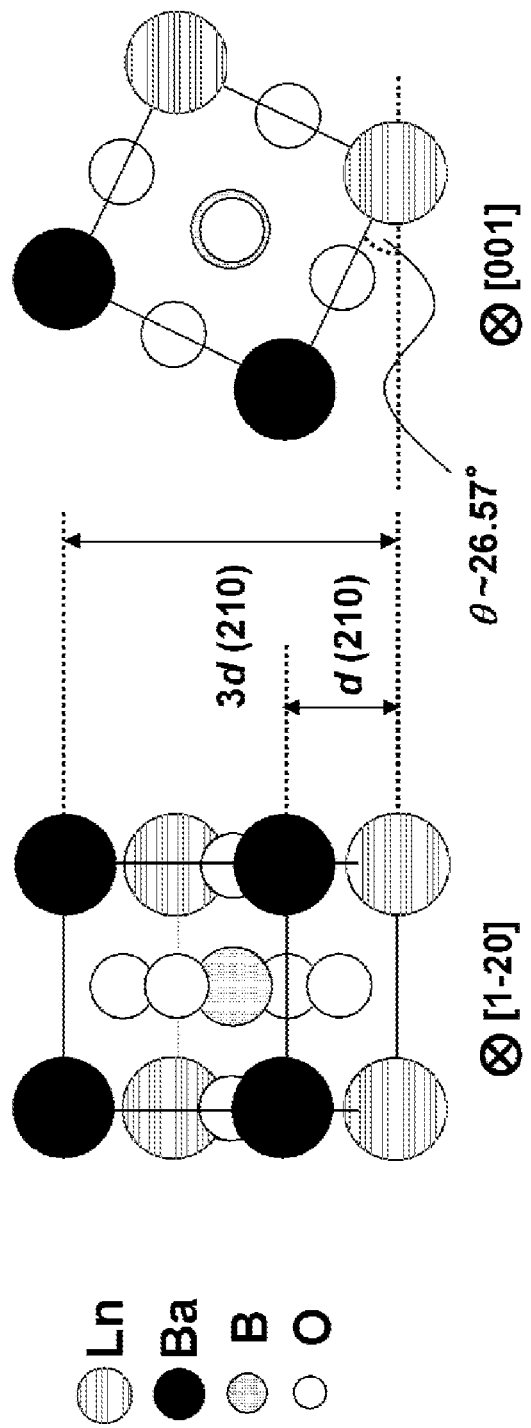

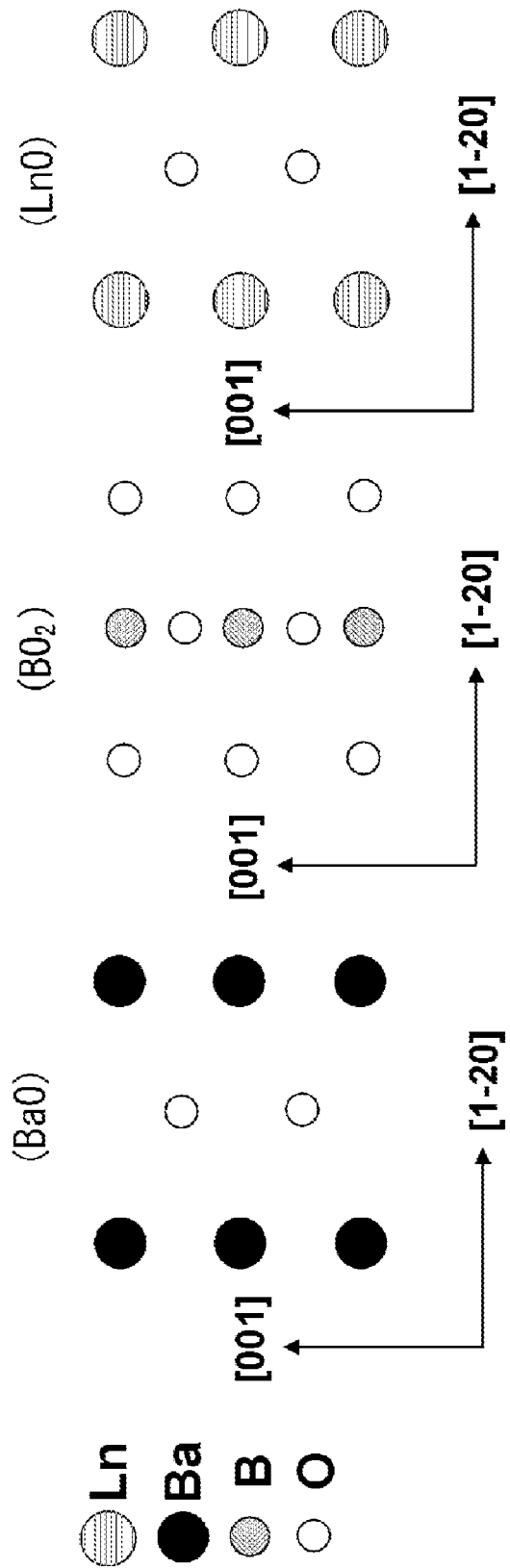
FIG. 7A (BaO)
FIG. 7B (BO$_2$)
FIG. 7C (LnO)

PEROVSKITE MANGANESE OXIDE THIN FILM AND MANUFACTURING METHOD THEREFOR

BACKGROUND OF THE INVENTION

1. Field of the Invention

The present invention relates to a perovskite manganese oxide thin film and a manufacturing method therefor. More specifically, the present invention relates to a perovskite manganese oxide thin film the electrical, magnetic or optical properties of which are switched in response to a stimulus such as temperature, electrical field, magnetic field or light exposure, and to a manufacturing method therefor.

2. Background of the Related Art

There has been concern in recent years that semiconductor devices may be facing the limits of the scaling law, which has been a guiding principle of performance advances in the field. In this context, materials are being developed that will make new operating principles possible in order to weather the crisis when the transistor limit is reached. For example, in the field of spintronics, which exploits the spin degrees of freedom of electrons, there has been development aimed at high-density non-volatile memories capable of high-speed operation at the same level as DRAM (dynamic random access memory).

There has also been progress in research into materials having strongly-correlated electron systems that cannot be described in terms of band theory, which is the cornerstone of semiconductor device design. Substances have been discovered that exhibit very large and rapid changes in physical properties caused by phase changes in the electron system. In strongly correlated electron system materials, a variety of electron phases with a variety of orders formed by spins, charges and orbitals are possible because the phase state of the electron system is affected not only by the spin degrees of the freedom but also by the degrees of freedom of the electron orbitals. Typical examples of strongly correlated electron system materials are the perovskite manganese oxides, in which a first order phase transition produces a charge-ordered phase by alignment of 3d electrons of manganese (Mn) and an orbital-ordered phase by alignment of the electron orbitals.

In a charge-ordered phase or orbital-ordered phase, electrical resistance increases because the carrier is localized, and the electron phase becomes an insulator phase. The magnetic behavior of this electron phase is that of an antiferromagnetic phase due to the double exchange interactions. The electron states of the charge-ordered phase and orbital-ordered phase should often be regarded as semiconductor states. This is because although the carrier is localized in the charge-ordered phase and orbital-ordered phase, the electrical resistance is lower than that of a so-called band insulator. In accordance with convention, however, the electron phases of the charge-ordered phase and orbital-ordered phase are here called insulator phases. Conversely, when the behavior is metallic with low resistance, the electron phase is a ferromagnetic phase because the spins are aligned. The term "metallic phase" is defined in various ways, but here a metallic phase is one in which "the temperature derivative of resistivity is positively signed". Expressed in this way, the aforementioned insulator phase can be re-defined as one in which "the temperature derivative of resistivity is negative".

A variety of switching phenomena have reportedly been observed in bulk single-crystal materials made of substances capable of assuming either the aforementioned charge-ordered phase or orbital-ordered phase, or a phase that combines both a charge-ordered phase and an orbital-ordered phase (charge- and orbital-ordered phase), see Patent Documents 1 to 3, i.e., Japanese Patent Application Publication Nos. H08-133894, H10-255481, and H10-261291. These switching phenomena occur in response to applied stimuli, namely, temperature changes around the transition point, application of a magnetic or electric field, or light exposure. These switching phenomena are typically observed as very large changes in electrical resistance and antiferromagnetic-ferromagnetic phase transitions. For example, resistance changes by orders of magnitude in response to application of a magnetic field are a well-known phenomenon called colossal magnetoresistance.

To achieve any device with a high degree of utility using a perovskite manganese oxide, the switching phenomena must be manifested at room temperature or above, such as an absolute temperature of 300 K or more. However, the switching phenomena disclosed in the aforementioned documents of prior art have all been verified only under low-temperature conditions of about liquid nitrogen temperature (77 K) or less for example. In the perovskite manganese oxides disclosed in the aforementioned documents of prior art, trivalent rare earth cations (hereunder represented as "Ln") and a divalent alkaline-earth ("Ae") randomly occupy the A sites in the crystal structure of the perovskite. It is thought that the temperature at which the switching phenomena are manifested is lowered as a result of this randomness. In fact, it is known that the transition temperature for the charge-ordered phase can be elevated to about 500 K by ordering the A-site ions in an $AeO-BO_2—LnO-BO_2—AeO-BO_2—LnO-BO_2$ . . . configuration. Regular arrangement of the ions occupying the A sites as in this example is called "A-site ordering" below. A feature of the group of substances exhibiting such high transition temperatures is that they contain Ba (barium) as an alkaline-earth Ae. For example, transition temperatures above room temperature have been reported with substances containing Ba as an alkaline-earth Ae and using Y (yttrium), Ho (holmium), Dy (dysprosium), Tb (terbium), Gd (gadolinium), Eu (europium) and Sm (samarium) as rare earths Ln with small ionic radii.

For these phenomena to be used in an electronic device, magnetic device or optical device, the switching phenomena must also be manifested when the substance is in the form of a thin film, Conventionally, the problem has been that if a single-crystal thin film of a perovskite manganese oxide is prepared by deposition on a (100) oriented substrate, the switching phenomena are not manifested in the resulting (100) oriented perovskite manganese oxide single-crystal thin film. This is because the in-plane crystal lattice of the single-crystal thin film is fixed to the in-plane crystal lattice of the substrate, and the first orderphase transition to a charge-ordered phase or orbital-oriented phase requires a kind of lattice deformation called Jahn-Teller deformation, which is suppressed by in-plane fourfold symmetry of the substrate. On the other hand, Patent Document 4, i.e., Japanese Patent Application Publication No. 2005-213078, discloses a perovskite oxide thin film formed using a substrate with a (110) orientation. According to this disclosure, the formed thin film allows shear deformation of the crystal lattice during switching when the in-plane fourfold symmetry of the (110) oriented substrate is broken. That is, in a thin film formed in accordance with Patent Document 4 the crystal lattice is oriented parallel to the substrate plane, while the charge-ordered plane or orbital-ordered plane is non-parallel to the substrate plane. As a result, first order phase transitions accompanied by deformation of the crystal lattice are possible even with a single crystal thin film in which the in-plane crystal lattice is fixed to the in-plane lattice of the substrate.

Thus, according to Patent Document 4, a transition or in other words a switching phenomenon at high temperatures equivalent to those obtained with the bulk single crystal can be achieved by using a (110) oriented substrate.

Furthermore, Patent Document 5, i.e., Japanese Patent Application Publication No. 2008-15618, discloses an example of a thin film formed from a perovskite manganese oxide with A-site ordering as discussed above. According to Patent Document 5, a thin film in an amorphous state was first formed by a photo-assisted deposition process, and then laser annealed to achieve crystallization and A-site ordering. Specifically, A-site ordering of a $SmBaMn_2O_6$ thin film formed on a (100) oriented $SrTiO_3$ (lattice constant 0.3905 nm) substrate was confirmed by electron beam diffraction.

However, switching is suppressed in a single-crystal thin film of perovskite manganese oxide formed on a (100) substrate. As a result, even if a substance or material exhibiting a charge-ordered phase within a temperature range suited to practical use (such as room temperature) can be prepared using a bulk single crystal, it cannot immediately be applied to a device. Patent Document 5 does not disclose whether or not the thin film subjected to A-site ordering is a single-crystal thin film, but supposing it to be a polycrystalline film, or in other words a film comprising multiple grains with different crystal orientations on the same substrate, A-site ordering and charge and orbital ordering would then be impeded by lattice defects in the thin film. Thus, in the substance formed as a thin film in Patent Document 5 there is a concern of a decreased transition temperature or even the loss of the first order phase transition itself in extreme cases.

As in the case of ordinary semiconductor devices, a defect-free single-crystal thin film is necessary in order to achieve high-performance switching properties without variation in a single-crystal thin film of a perovskite manganese oxide. One possible way of doing this is by using a (110) oriented substrate as disclosed in Patent Document 4 and the like. In a (110) oriented thin film, the atomic plane is $(Ln,Ba)BO-O_2-(Ln,Ba)BO$. This describes a layered atomic structure obtained by forming one atomic layer consisting of A sites containing Ba atoms or a rare earth element Ln, B sites, and O atoms, and then forming an atomic layer containing two 0 atoms. Thus. A-site ordering must be achieved within a plane parallel to the atomic plane. However, some factor must provide a driving force for ordering the A-sites within the plane. In fact no such factor exists, and ordering the A-sites of a (110) oriented thin film is not an easy matter.

As discussed above, the problem has been that a charge-ordered phase capable of manifesting switching phenomena at a temperature range of room temperature and above cannot be achieved in a thin film of perovskite oxide simply by combining prior art. The present invention, which was developed in light of the problems described above, contributes to the preparation of various devices using perovskite manganese oxide thin films by (1) allowing first order phase transitions, while at the same time (2) achieving A-site ordering, both features which are necessary to achieve switching that operates at room temperature.

The inventor of this application examined these problems closely, focusing on the relationship between the atomic plane of the thin film and the symmetry within that plane. The inventor then discovered means for solving these problems.

SUMMARY OF THE INVENTION

One aspect of the present invention provides a perovskite manganese oxide thin film formed on a substrate, containing Ba and a rare earth element in the A sites, and having an (m10) orientation (m=2n; 9≥n≥1). This aspect thus provides an article including a perovskite manganese oxide thin film, comprising: a substrate; and a perovskite manganese oxide thin film formed on the substrate and having a perovskite crystal lattice with A sites, the perovskite manganese oxide thin film containing Ba and a rare earth element in the A sites, and having an (m10) orientation for which m=2n; and 9≥n≥1.

With this configuration, the atomic plane of a single-crystal thin film of perovskite manganese oxide assumes an $AO-BO_2-AO-BO_2-\ldots$ structure. As a result, it is possible to order the A sites while growing the thin film as $AeO-BO_2-LnO-BO_2\ldots$ in the direction of film thickness, and a first order phase transition (which was suppressed with the (100) orientation) is possible because the in-plane symmetry is broken. An even number is selected for m in order to obtain an $AO-BO_2-AO$ atomic plane. m cannot be an odd number because the atomic plane would then be $ABO-O_2-ABO$.

In a perovskite crystal lattice represented as $ABO_3$, considered as a cube with an oxygen octahedral in the face centers, or more generally as a parallelepiped, the A sites are the lattice points forming the apices of the cube or the like. The term "(m10) orientation" here means the orientation of a crystal lattice (hereunder called an "orientation") formed so that the Miller index indicating the film surface or in other words the surface of the thin film parallel to the substrate plane is (m10). The orientation is (110) when m=1, meaning an orientation in which the (100) plane is inclined at an angle of 45° around the [001] axis contained in that plane (in-plane [001] axis). The angle of the (100) plane relative to the thin film surface is determined by the following formula for ordinary values of m:

$$\theta = \arctan(1/m) \quad \text{Formula 1.}$$

For example, substituting m=1 into Formula 1 gives a value of 45° for angle θ as described above, while substituting m=2 (n=1) gives an angle θ of 26.56 degrees. Thus, as the integer m increases, the (100) plane in a thin film having an (m10) orientation becomes more nearly parallel to the thin film surface or substrate plane.

Thus, if m=18 (n=9) for example in Formula 1, then angle θ is 3.18 degrees. Thus, a thin film surface can be described not only in terms of its plane index, but also in terms of angle θ. In this case, angle θ is also called the off angle especially when the incline of the substrate plane is slight. The correspondence between this angle θ and the plane index is of course given by Formula 1. In particular, the upper limit of m (or n) works out to 18.1=m (that is, 9 n). This upper limit of m (or n) corresponds to an even number of m (integer value of n) that gives a value larger than 3 degrees for the off angle (angle θ) of the (100) plane. This is because it has been confirmed experimentally that the lattice deformation necessary for a first order phase transition is suppressed if the off angle is 3 degrees or less.

Moreover, m is preferably 2 in a perovskite manganese oxide thin film of this aspect of the present invention, giving a (210) orientation. This aspect thus provides an article including a perovskite manganese oxide thin film, comprising: a substrate; and a perovskite manganese oxide thin film formed on the substrate and having a perovskite crystal lattice with A sites, the perovskite manganese oxide thin film containing Ba and a rare earth element in the A sites and having a (210) orientation.

With this configuration, it is easiest to prepare an A-site ordered thin film while growing the thin film in the direction of film thickness in this aspect of the present invention. As discussed above, the (m10) plane is equivalent to the (100) plane inclined around the in-plane [001] axis so as to fulfill Formula 1. The lattice spacing along the plane of the thin film is affected by this inclination. Specifically, while the lattice spacing in the direction of the in-plane [001] axis is the same as with a (100) orientation, the lattice spacing in the [1-m0] axis direction perpendicular to the in-plane [001] axis becomes greater as m increases. Consequently, as the value of m increases it becomes more difficult to specify the atomic positions, and crystal growth becomes more difficult. In addition, as m increases the spacing of the atomic layers becomes narrower in the direction perpendicular to the plane (the thin film growth direction), and it becomes more difficult to specify the surface. For these reasons, the most desirable of the (m10) planes from the standpoint of thin film preparation is the (210) orientation, which has the smallest index.

Moreover, in a perovskite manganese oxide thin film of this aspect of the present invention, the substrate is preferably a (210) plane perovskite single crystal.

This configuration allows for epitaxial growth using the substrate orientation in this aspect of the present invention, thereby facilitating preparation of a (210) oriented single-crystal thin film of an A-site ordered perovskite manganese oxide.

A method for manufacturing a perovskite manganese oxide thin film is also provided by one aspect of the present invention. That is, one aspect of the present invention provides is a method for manufacturing a perovskite manganese oxide thin film having a perovskite crystal lattice with A sites and containing Ba atoms and a rare earth element in the A sites, the method comprising: forming in a controlled atmosphere using laser ablation an atomic layer or thin film that assumes a pyramidal structure having oxygen-deficient sites in a plane containing the rare earth element and oxygen; and filling the oxygen-deficient sites in the pyramidal structure with oxygen, wherein the controlled atmosphere has an oxygen partial pressure that is controlled to a thermodynamically required value for creating oxygen deficiencies in the pyramidal structure, while at the same time the controlled atmosphere contains a gas other than oxygen and has a total pressure that is controlled to a value at which the A sites have a compositional ratio that does not fluctuate.

With this configuration, it is possible to fabricate a perovskite manganese oxide thin film that resists changes to the A-site compositional ratio, without greatly changing the preparation conditions from those of conventional perovskite manganese oxide thin films.

In all aspects of the present invention, an A-site ordered perovskite manganese oxide thin film is achieved that exhibits a transition temperature for the charge-ordered phase or orbital-ordered phase of room temperature or above, which is necessary for switching operations at room temperature.

BRIEF DESCRIPTION OF THE DRAWINGS

FIGS. 2A and 2B are schematic side views showing the inclination of a crystal lattice grown with a (210) orientation in a cubic perovskite structure of an embodiment of the present invention in which FIG. 2A is a side view seen from the in-plane [1-20] axis and FIG. 2B is a side view from the in-plane [001] axis;

FIG. 3 is drawn facing towards the in-plane [001] axis;

FIGS. 4A and 4B are horizontal cross-sections showing the atomic arrangement of the atomic layers in the plane of the substrate in the crystal lattice of a substrate and perovskite manganese oxide thin film of one embodiment of the present invention, shown for two planes parallel to the substrate plane and thin film surface, in which FIG. 4A is a cross-section on a plane containing A-site atoms and O (oxygen) atoms and FIG. 4B is a cross-section on a plane containing B-site atoms and O atoms;

FIGS. 5A and 5B are schematic side views of an $LnBaMn_2O_6$ crystal lattice comprising a rare earth element Ln and alkali earth element Ba ordered in the A sites of a cubic perovskite structure of an embodiment of the present invention in which FIG. 5A is a side view shown from the in-plane [1-20] axis and FIG. 5B is shown from the in-plane [001] axis;

FIGS. 7A, 7B, and 7C are horizontal cross-sections showing the atomic arrangement of the atomic layers in the substrate plane of a $LnBaMn_2O_6$ crystal lattice using a (210) orientation in an embodiment of the present invention, shown for two planes parallel to the substrate plane and thin film surface, in which FIG. 7A is a cross-section on a plane including Ln atoms and O (oxygen) atoms, FIG. 7B is a cross-section on a plane containing B-site atoms and O atoms, and FIG. 7C is a cross-section on a plane containing Ba atoms and O atoms.

DETAILED DESCRIPTION OF THE INVENTION

Figure 1:
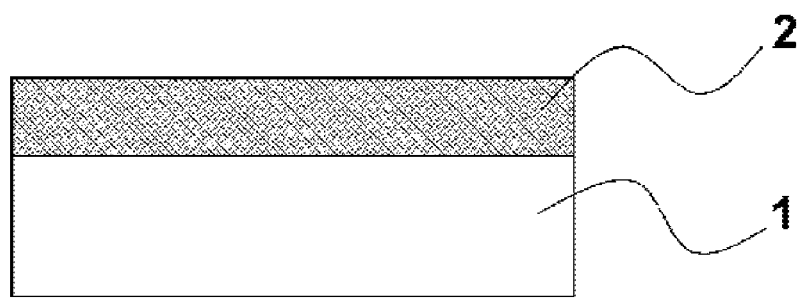
FIG. 1 is a schematic cross-section of a perovskite manganese oxide thin film formed on a substrate in an embodiment of the present invention.

Embodiments of the perovskite manganese oxide thin film of the present invention are explained below. Unless specifically mentioned in the explanations below, parts or elements that are common to all drawings are represented by the same symbols. In the drawings, the elements of the respective embodiments are not necessarily shown to the same scale.

First Embodiment

Using the example of a (210) orientation (corresponding to m=2 (n=1)) for the perovskite manganese oxide thin film of this embodiment, the surface flatness, crystal structure and transition temperature for the charge-ordered phase ($T_{co}$) are explained.

FIG. 1 is a rough cross-section of a perovskite manganese oxide thin film 2 (hereunder called "oxide thin film 2") formed on the surface of a substrate 1. In a sample for measuring the properties of the oxide thin film 2, an electrode (not shown) made of Au—Pd alloy is formed by sputtering on the thin film. This electrode is used in a four-terminal method for measuring the temperature dependence of electrical resistance or resistivity in order to investigate the transition temperature $T_{co}$. An $SrTiO_3$ substrate having a (210) plane surface (hereunder called a "$SrTiO_3$ (210) substrate") is used as the substrate 1 for example. A $SmBaMn_2O_6$ thin film for example is used as the substance of the oxide thin film 2. This is because in $SmBaMn_2O_6$, the transition temperature $T_{co}$ for the charge-ordered phase is a value near 380 K, which is within the temperature range at which electrical resistance can be measured, and is therefore suited to investigating the applicability of this embodiment.

Figure 2:
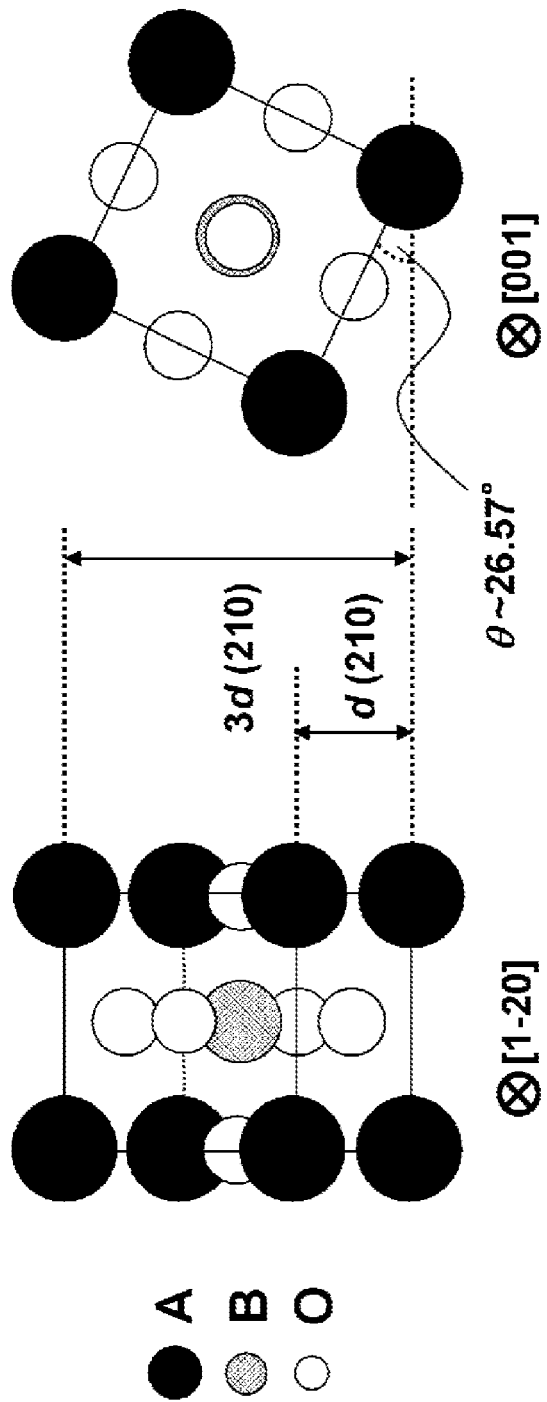

The (210) oriented cubic perovskite structure used in this embodiment is explained first with reference to FIG. 2. FIG. 2 is a schematic side view showing the inclination of the crystal lattice when a cubic perovskite structure is grown with a (210) orientation. Because in this embodiment the cubic perovskite structure is a crystal structure assumed by both the substrate 1 and the oxide thin film 2 formed epitaxially on the substrate, it will be explained without loss of generality. Perovskite structures are generally described by $ABO_3$, with A occupying the apices, B the body center, and O (oxygen) the face centers. In explaining this embodiment, the apex sites are called A sites and the atoms occupying them are called A atoms. The atoms occupying the center B sites are likewise called B atoms. The perovskite structure explained in this embodiment is explained in terms of the cubic crystal shown in FIG. 2, but this is only to simplify the explanation. Perovskite structures encompassed by this embodiment include not only cubic but also tetragonal, orthorhombic and monoclinic structures and the like, in which the aforementioned A, B and O atoms are arranged at any positions in a crystal lattice with any deformations. Also, for example substances with crystal structures in which the basic unit lattice is only obtained by linking a plurality of the unit cells discussed above are also included in this embodiment.

In FIG. 2, the up-down direction in the figure as seen on the paper surface is the thin-film growth direction ([210] axis; hereunder called the "direction perpendicular to the plane"), and the substrate plane and thin film plane perpendicular to this ((210) plane, or in other words the plane including the [1-20] and [001] axial directions) extend to the left and right in the figure. FIGS. 2A and 2B show a side view of a unit cell looking toward the in-plane [1-20] axis (FIG. 2A and a side view of a unit cell looking toward the in-plane [001] axis (FIG. 2B).

The angle of the (100) plane relative to the substrate plane, or in other words the angle θ from the (100) plane before inclination, is about 26.56 degrees as determined by Formula 1. In the substrate 1 or oxide thin film 2, the atomic planes are stacked alternating $AO-BO_2-AO$ . . . in the direction perpendicular to the surface. In the case of an $SrTiO_3$ (210) substrate, the lattice spacing of the (210) planes perpendicular to the surface is given by:

$$d(210)=a\cdot\sin\theta \qquad \text{Formula 2.}$$

Substituting 26.56 degrees for θ and 0.3905 nm for a gives 0.1746 nm as d(210). Considering that the unit cells of the cubic crystal are inclined 26.56 degrees from the (100) plane orientation, the spacing perpendicular to the surface is 3d(210) or 0.5238 nm. FIG. 2A shows an example of the spacing represented by d(210) and 3d(210). Considering also the periodicity of the in-plane atomic positioning, the length period perpendicular to the surface is 5d(210) or 0.873 nm.

Figure 3:
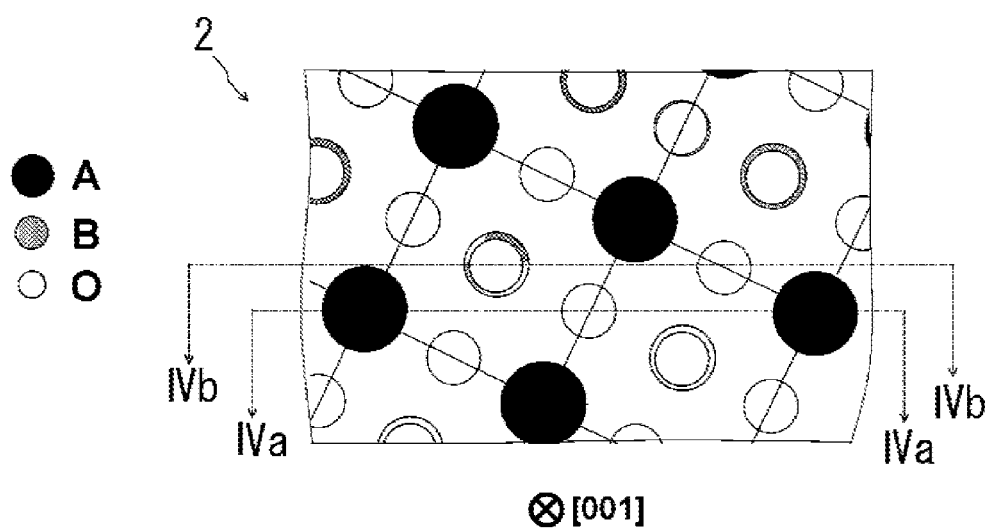
FIG. 3 is an enlarged view of one part of the crystal lattice in a cubic perovskite structure using (210) orientation in one embodiment of the present invention.
Figure 4A:
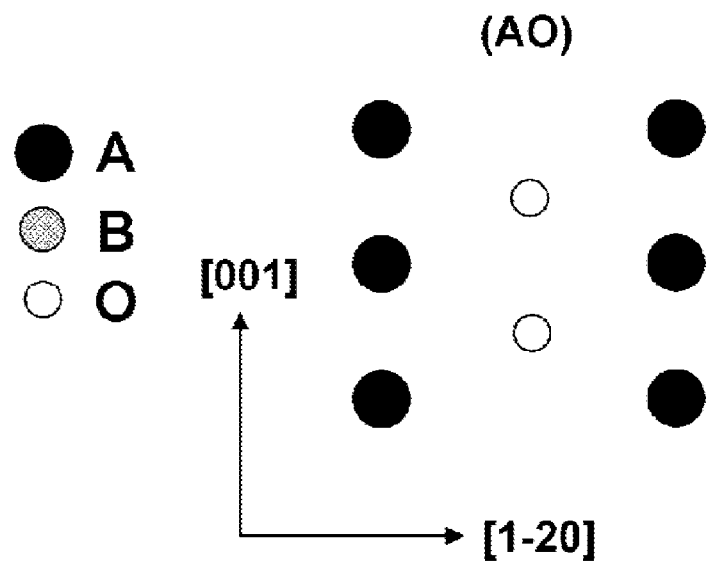
Figure 4B:
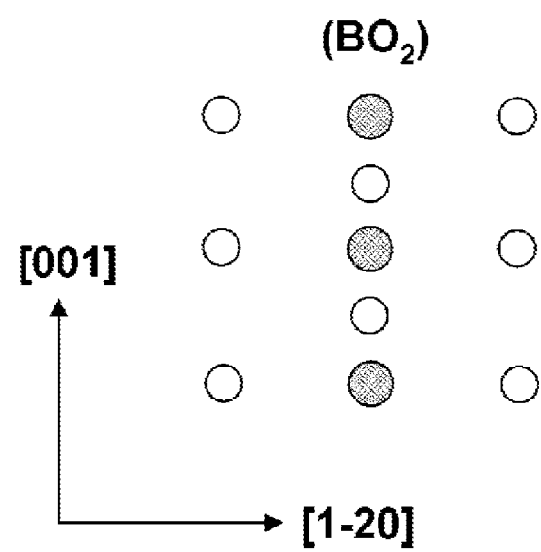

FIG. 3 is an enlarged view of one part of the crystal lattice in a cubic perovskite structure using (210) plane orientation in one embodiment of the present invention. FIG. 3 is drawn facing towards the in-plane [001] axis. FIG. 4 is a horizontal cross-section showing the atomic arrangement of the atomic layers in the plane of the substrate in the crystal lattice of the substrate 1 and perovskite manganese oxide thin film 2, shown for two planes parallel to the substrate plane and thin film surface. In the figure. FIG. 4A is a cross-section on a plane including A-site atoms and O (oxygen) atoms, or in other words an AO layer, while FIG. 4B is a cross-section on a plane containing B-site atoms and O atoms, or in other words a $BO_2$ layer. The positions of each cross-section are shown clearly in FIG. 3. In FIGS. 4A and 4B, the up-down direction in the figure looking towards the paper surface is the in-plane [001] axis, while the left-right direction is the [1-20] axis.

As shown in FIG. 3, when using a (210) orientation, AO layers and $BO_2$ layers constitute all the atomic layers of the substrate 1 and the oxide thin film 2. These atomic layers are separated from each other by only a distance equal to ½ d(210), which is the shortest length period in the direction perpendicular to the plane as explained above. In these atomic layers, as shown in FIGS. 4A and 46, while the lattice spacing in the direction of the in-plane [001] axis is identical to the lattice spacing using a (100) plane as the growth plane, the lattice spacing in the direction of the in-plane [1-20] axis is greater than with a (100) plane orientation.

With respect to in-plane symmetry in particular, as shown in FIG. 2B, if the angle θ is smaller than 45 degrees the symmetry with respect to the in-plane [1-20] axis is lost, resulting in asymmetry. Thus, the central symmetry is effectively broken. That is, the fourfold symmetry seen with a (100) oriented substrate is broken in this embodiment. This is the reason why a first order phase transition is possible in the oxide thin film 2.

Figure 6:
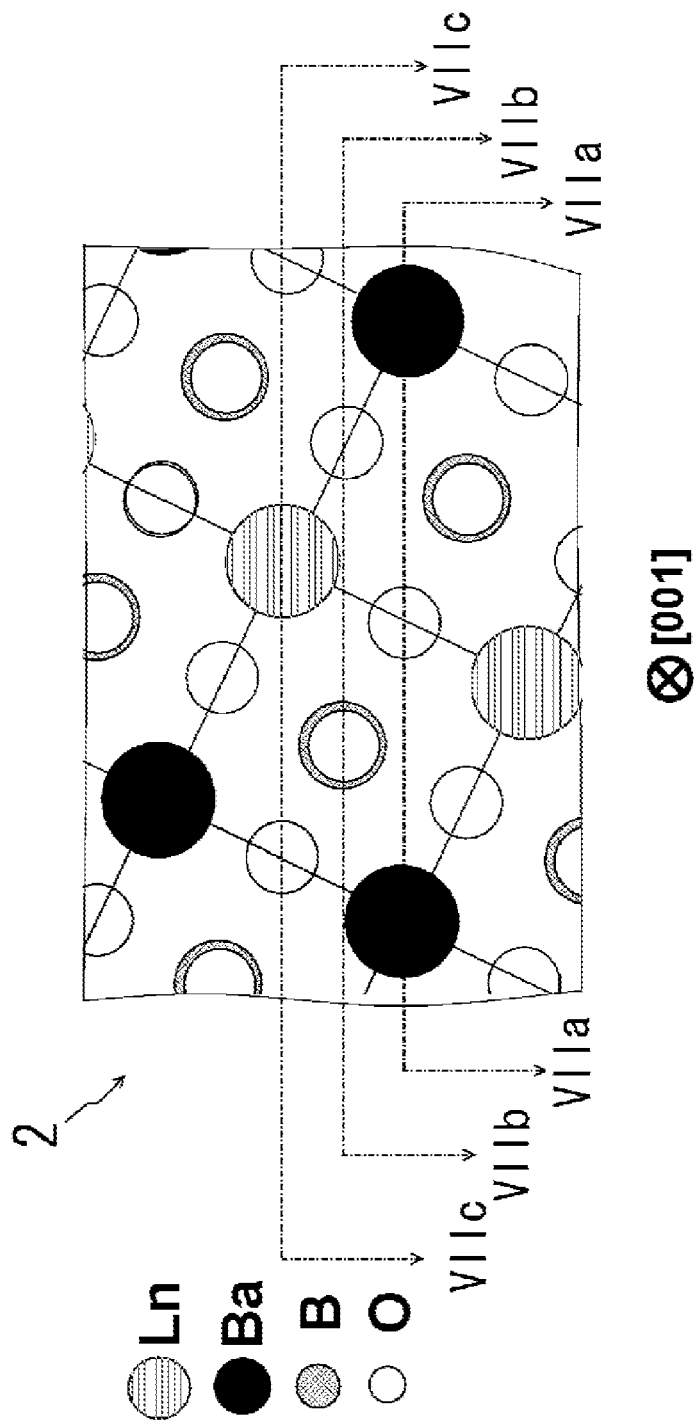
FIG. 6 is an enlarged view of part of a $LnBaMn_2O_6$ crystal lattice using a (210) orientation in an embodiment of the present invention.

The crystal structure of the A-site ordered oxide thin film 2 of this embodiment is explained next. FIGS. 5 to 7 show one example of the oxide thin film 2 of this embodiment, $LnBaMn_2O_6$, using the same projections as in FIGS. 2 to 4. As can be seen by comparing FIGS. 2 and 5, the $LnBaMn_2O_6$ of the oxide thin film 2 has a crystal structure in which the alkaline-earth element Ba and the rare earth element Ln are ordered in the A sites. When forming the $LnBaMn_2O_6$ of this oxide thin film 2, atomic layers of the AO plane shown in FIG. 4A are formed alternatingly as BaO layers (FIG. 7A) and LnO layers (FIG. 7C) to form the thin oxide film 2. Specifically, as shown in FIGS. 6 and 7, atomic layers in the sequence BaO—$BO_2$—LnO-$BO_2$—BaO-$BO_2$—LnO-$BO_2$ . . . are grown coherently on the substrate in the direction perpendicular to the plane (thin film growth direction). As a result, a layered body of atomic layers maintaining this sequence is created artificially. Thus, a regular order is introduced into the arrangement of the Ln and Ba atoms in the A sites of the crystal lattice of the $LnBaMn_2O_6$ in the oxide thin film 2 of this embodiment. In this way, A-site ordering of the oxide thin film 2 of this embodiment is achieved by controlling the selective growth of the atomic layers.

Examples and Comparative Examples

Next, the present invention is explained in more detail using examples prepared in accordance with the embodiments described above. The materials, amounts, proportions, processing methods, procedures and the like shown in the following examples can be changed appropriately as long as the intent of the present invention is not violated. Thus, the scope of the present invention is not limited to the following examples. In the examples, the substrate processing and thin film processing are explained first, after which the measurement results for the example and comparative examples are explained.

First, a $SrTiO_3$ (210) substrate was prepared as the substrate 1. The surface planarization for purposes of film formation on one surface of the substrate 1 is explained here. As-prepared $SrTiO_3$ (210) substrate does not have a stepped surface unlike in the case of a stepped (100) substrate. In fact, when the surface of the $SrTiO_3$ (210) substrate 1 was observed by AFM (atomic force microscopy), the surface was confirmed to be flat at a nm level, and not even atomic steps and terraces or other regular structures were observed. Usually, on a $SrTiO_3$ substrate with a (100) or (110) orientation, a surface exhibiting steps and terraces is obtained even without stepping by subjecting the substrate to the film-growth conditions for the perovskite manganese oxide thin film (substrate temperature 800 to 900° C., oxygen partial pressure 0.1 to 10 mTorr ($1.3\times10^{-2}$ to 1.3 Pa)). However, no such surface was observed with the $SrTiO_3$ (210) substrate 1. As discussed above, one reason for this may be that it is more difficult to specify the surface in the direction perpendicular to the plane with a (210) surface than with a (100) or (110) surface.

Therefore, with the aim of obtaining regular structures with surface planarization, a as-prepared $SrTiO_3$ (210) substrate sample was annealed in atmosphere and used as the substrate 1 of this example. The annealing conditions were determined in advance by fixing the annealing time and changing the setting temperature of the annealing furnace (annealing temperature). Specifically, the annealing time was set at 12 hours, and the annealing temperature was varied from 1000° C. to 1100° C. and 1150° C. for each sample. The surface of each substrate sample was observed after annealing at each temperature. When the surface of each substrate sample was observed after annealing, no change in surface structure was observed with a temperature of 1000° C. However, regular structures in the form of steps and terraces were formed when the substrate was annealed at 1100° C., and it was clear that the terrace regions had been planarized at the atomic layer level. The atomic layer step in the direction perpendicular to the (210) plane was extremely small at $(\frac{1}{2})d(210)=0.0873$ nm, but since annealing causes step bunching, it is thought that steps were formed of 0.5238 nm (corresponding to 3d(210)) and 1.046 nm (corresponding to 6d(210)). Annealing at 1150° C. produced precipitates in the substrate sample. Based on this preliminary research, the optimal substrate annealing temperature was set at 1100° C., and the surface of substrate 1 was planarized under these conditions.

Next, the preparation of a $SmBaMn_2O_6$ thin film by laser ablation is explained as the film-fabrication technique used in the examples. A polycrystalline material prepared by a solid-phase reaction method was molded into a $\phi 20$ mm×5 mm cylindrical shape for use as the target. First, the $SrTiO_3$ (210) substrate used as the substrate 1 and the aforementioned target were mounted inside a vacuum chamber, which was then evacuated to $3\times10^{-9}$ Torr ($5.3\times10^{-7}$ Pa) or less. Highly pure oxygen gas was then introduced to a partial pressure of $0.9\times10^{-5}$ Torr ($1.2\times10^{-3}$ Pa), after which Ar gas was introduced into the vacuum chamber to a total pressure of about 5 mTorr ($6.7\times10^{-1}$ Pa). The substrate was then heated to 1040° C. under these conditions.

The reason why the oxygen pressure and total pressure were controlled separately was in order to apply the previously established film-growth conditions in the preparation of this example. This point is explained in more detail. Because the A sites must be ordered in this example, the compositional ratio of the formed thin film needs to be as constant as possible. This is because if the compositional ratio shifts, excess elements are incorporated into the sites of their counterparts (the elements they pair with), which inevitably reduces the degree of ordering. To prevent this decrease in ordering by precisely determining the film-growth conditions without relying on background knowledge is an extremely time-consuming process. Thus, if it were possible to apply the previously-established film-growth conditions, or in other words to exploit the film-growth conditions established for ordinary perovskite manganese oxide films, it would be possible to effectively prevent the aforementioned compositional shifts.

More specifically, performing A-site ordering by laser ablation involves a 2-stage process. In the first stage (first step), the larger on radius of the Ba on is used to form a pyramidal structure with SmO plane oxygen deficiencies in the positions that normally form the oxygen octahedral. In this step, an A-site ordered structure is formed using electrostatic differences. The second stage (second step) is a stage of filling the oxygen deficiencies created in the first stage. When using this step-by-step process, processing in the first stage must be carried out in a reducing atmosphere. Because this processing in a reducing atmosphere in the first stage is carried out by a conventional laser ablation method, oxygen has commonly been used alone as the introduced gas. When it has been necessary to form the film in a reducing atmosphere, the film-growth conditions have then been changed by simply lowering the oxygen partial pressure. However, changing the conditions in this way also changes the plume shape during laser ablation. The plume here means the balloon-shaped plasma generated during laser ablation, and bias of composition is unavoidable in this plume. A change in plume shape caused by decreasing the oxygen partial pressure also changes the position where the plume impacts the substrate, causing a problem of discrepancies in the film-growth conditions related to composition, or in other words shifts in composition.

The researches of the inventor of this application have revealed a technique for preventing shifts in composition without changing the plume shape even while lowering the oxygen partial pressure. Previously, no special care has been taken in changing the conditions when lowering the oxygen partial pressure, and the total pressure of the atmosphere has also been changed. The aforementioned changes in plume shape are greatly affected by this total pressure, and it has been shown that if the total pressure can be maintained at a suitable value while lowering the oxygen partial pressure, the plume shape is much less affected. Therefore, previously established film-growth conditions can be applied to the preparation of the examples of this embodiment if the thermodynamically required oxygen partial pressure and the total pressure required for maintaining the characteristic plume shape for laser ablation can be controlled independently.

The aforementioned two-stage film-growth method in which the oxygen partial pressure and total pressure are each controlled independently in the first step is also applied to this example. In the first step, the oxygen partial pressure and total pressure were first controlled, and the target was then exposed through the chamber's laser beam entry port to a KrF excimer laser with a wavelength of 248 nm, to thereby form a $SmBaMn_2O_6$ thin film with a film thickness of about 40 nm. The surface of the thin film was observed in situ during thin film growth by RHEED (reflection high-energy electron diffraction). Because the (210) substrate is anisotropic, information about the (1-20) surface was obtained as a diffraction pattern when an electron beam was directed parallel to the in-plane [001] axis. Similarly, information about the in-plane (001) plane was obtained when the beam was directed parallel to the in-plane [1-20] axis. When an electron beam was directed parallel to the in-plane [1-20] axis, the observed RHEED pattern of Laue spots and streaks was similar to that of a thin film formed on a (100) oriented substrate, and epitaxial growth of a flat thin film at the nm scale level was confirmed on the substrate.

As the second step, the thin film after growth was annealed in-situ at 400° C. to fill the oxygen deficiencies. The $O_2/Ar$ ratio of the annealing atmosphere was adjusted carefully so as not to disrupt the A-site ordering. A different method of performing the second step is to remove the substrate with the formed film from the vacuum chamber, and then fill the oxygen deficiencies by post-annealing. It is confirmed that $N_2O$ is effective as the atmospheric gas in this case, because it allows the oxygen deficiencies to be filled without disrupting the A-site ordering.

Furthermore, when the substrate 1 with the formed film of this example was removed after preparation, and the surface of the formed thin film was observed by AFM, a flat surface at the atomic layer level was confirmed. The formed thin film was also subjected to reciprocal lattice space mapping. This measurement was performed by 4-axis X-ray diffraction, mapping around (211) and (310). As a result, the formed thin film was shown to be a single-crystal oxide thin film 2 grown coherently on the substrate 1. Electron beam diffraction was also performed in a controlled field using an electron microscope. The existence of a superlattice peak in this measurement confirmed that A-site ordering had been achieved in the formed thin film, and the intended oxide thin film 2 had been formed.

Thus, the perovskite manganese oxide thin film 2 formed on a $SrTiO_3$ (210) substrate as the substrate 1 in this example was confirmed to have a flat surface at the atomic layer level, and to be grown coherently on the substrate 1 without mismatches or other defects. In addition, it was confirmed that an A-site ordered (210) oriented single crystal thin film can be obtained by implementing this embodiment.

Next, a comparative example was prepared using a $SrTiO_3$ (100) substrate for purposes of comparison with the example using the $SrTiO_3$ (210) substrate. This comparative example was prepared under the same conditions as in the example except for the change of substrate.

Finally, the transition temperatures of the example of this embodiment and the comparative example were measured and compared. Specifically, the temperature dependence of electrical resistance in the [001] axis direction was investigated for the two $SmBaMn_2O_6$ thin films of the example and comparative example. For the measurements, the samples of the example and comparative example were first cooled to a low temperature (liquid nitrogen temperature=77 K), and the temperature was then raised at a fixed rate as changes in electrical resistance were measured by the four-terminal method. As a result, only a uniform decrease in resistance was seen with the (100) oriented $SmBaMn_2O_6$ thin film of the comparative example at a temperature range up to 400 K, and there was no obvious resistance change associated with charge ordering. On the other hand, with the (210) oriented $SmBaMn_2O_6$ thin film of the example an obvious resistance change near 390 K was seen in addition to the resistance decrease due to temperature elevation. This shows that a first order phase transition of the oxide thin film 2 is possible with the example using a (210) crystal orientation for the substrate and oxide thin film 2. As mentioned before, the $T_{co}$ of the bulk single crystal is 380 K. The inventor of the present application believe that the reason why a first order phase transition is achieved in the oxide thin film 2 using a (210) plane crystal orientation of the example is that the in-plane symmetry is broken in the (210) plane.

As explained above, in a (210) oriented perovskite manganese oxide thin film, the A sites can be ordered while growing the thin film as $LnO-BO_2-AeO-BO_2$ in the direction of film thickness because the atomic plane consists of $AO-BO_2-AO$, and a first order phase transition (which is suppressed with a (100) plane orientation) is achieved because the in-plane symmetry is broken. As a result, the transition temperature $T_{co}$ is room temperature or higher. The same effects can be expected in a (m10) oriented thin film (m=2n; 9≥n≥1) because the in-plane symmetry is similarly broken. The materials of the thin film and substrate given as examples of the embodiment and their compositions, film thicknesses, formation methods are the like are not limited to this embodiment.

Embodiments of the present invention were explained above. The embodiments and examples given above are described in a way that explains the present invention, and the scope of the invention of the present application is determined based on the descriptions of the Claims. Modified examples within the scope of the claims, including other combinations of the embodiments, are included in the Claims.

The present invention can be used in devices using perovskite manganese oxide thin films the electrical, magnetic and optical properties of which exhibit phase transitions and switching phenomena in response to electrical fields, magnetic fields and light exposure.

The invention claimed is:

1. An article including a perovskite manganese oxide thin film, comprising:
    a substrate; and
    a perovskite manganese oxide thin film formed on the substrate and having a perovskite crystal lattice with A sites, the perovskite manganese oxide thin film containing Ba and a rare earth element in the A sites, and having an (m10) orientation for which m=2n and 9≥n≥1.

2. The article according to claim 1, wherein m is 2 and the (m10) orientation of the perovskite manganese oxide thin film is a (210) orientation.

3. The article according to claim 1, wherein the perovskite manganese oxide thin film is represented by the chemical formula $SmBaMn_2O_6$.

4. The article according to claim 1, wherein the substrate is a (210) plane-oriented perovskite single crystal.

5. The article according to claim 4, wherein the substrate is a $SrTiO_3$ substrate having a (210) plane on the surface.

6. A method for manufacturing a perovskite manganese oxide thin film having a perovskite crystal lattice with A sites and containing Ba atoms and a rare earth element in the A sites for the article according to claim 1, the method comprising:
    forming in a controlled atmosphere using laser ablation an atomic layer or thin film that assumes a pyramidal structure having oxygen-deficient sites in a plane containing the rare earth element and oxygen; and
    filling the oxygen-deficient sites in the pyramidal structure with oxygen,
    wherein the controlled atmosphere has an oxygen partial pressure that is controlled to a thermodynamically required value for creating oxygen deficiencies in the pyramidal structure, while at the same time the controlled atmosphere contains a gas other than oxygen and has a total pressure that is controlled to a value at which the A sites have a compositional ratio that does not fluctuate.

7. An article including a perovskite manganese oxide thin film, comprising:
    a substrate; and
    a perovskite manganese oxide thin film formed on the substrate and having a perovskite crystal lattice with A sites, the perovskite manganese oxide thin film containing Ba and a rare earth element in the A sites and having a (210) orientation.

8. The article according to claim 7, wherein the perovskite manganese oxide thin film is represented by the chemical formula $SmBaMn_2O_6$.

9. The article according to claim 7, wherein the substrate is a (210) plane-oriented perovskite single crystal.

10. The article according to claim 9, wherein the substrate is a $SrTiO_3$ substrate having a (210) plane on the surface.

* * * * *